(12) United States Patent
Jung (10) Patent No.: US 9,087,800 B2
(45) Date of Patent: Jul. 21, 2015

(54) ORGANIC LIGHT EMITTING DIODE DISPLAY

(71) Applicant: Samsung Display Co., Ltd, Yongin, Gyeonggi-Do (KR)

(72) Inventor: Young-Bae Jung, Yongin (KR)

(73) Assignee: Samsung Display Co., Ltd. (KR)

( * ) Notice: Subject to any disclaimer, the term of this patent is extended or adjusted under 35 U.S.C. 154(b) by 50 days.

(21) Appl. No.: 14/090,474

(22) Filed: Nov. 26, 2013

(65) Prior Publication Data

US 2015/0001482 A1  Jan. 1, 2015

(30) Foreign Application Priority Data

Jun. 26, 2013 (KR) .................. 10-2013-0073944

(51) Int. Cl.
*H01L 35/24* (2006.01)
*H01L 27/32* (2006.01)

(52) U.S. Cl.
CPC .......... *H01L 27/323* (2013.01); *H01L 27/3279* (2013.01)

(58) Field of Classification Search
CPC ................. H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254
USPC ......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS

| | | | |
|---|---|---|---|
| 8,415,872 B2* | 4/2013 | Choi et al. | 313/498 |
| 2011/0133215 A1* | 6/2011 | Kang et al. | 257/88 |
| 2011/0241562 A1* | 10/2011 | Choi et al. | 315/291 |
| 2012/0132903 A1* | 5/2012 | Yamazaki et al. | 257/43 |

FOREIGN PATENT DOCUMENTS

| | | | |
|---|---|---|---|
| KR | 10-2011-0041043 A | 4/2011 | |
| KR | 10-2011-0095669 A | 8/2011 | |
| KR | 10-2011-0117631 A | 10/2011 | |
| KR | 10-2013-0136187 A | 12/2013 | |

* cited by examiner

*Primary Examiner* — Dung Le
(74) *Attorney, Agent, or Firm* — Innovation Counsel LLP (57) ABSTRACT

An organic light emitting diodes display (OLEDD) includes means for implementing a capacitive touch position sensing panel and it (the OLEDD) is comprised of: a lower substrate; a driving element formed on the lower substrate; a first electrode connected to the driving element; an organic emission layer formed on the first electrode; a second electrode formed on the organic emission layer; a resistance lowering wire formed within the same layer as the first electrode and connected to the second electrode; an upper substrate disposed on the second electrode; and a plurality of Rx wires formed on the upper substrate and separated from each other, wherein the material of the second electrode is used to form a plurality of Tx wires separated from each other where the Tx and Rx wires define the capacitive touch position sensing panel.

11 Claims, 6 Drawing Sheets

ORGANIC LIGHT EMITTING DIODE DISPLAY

RELATED APPLICATIONS

This application claims priority to and the benefit of Korean Patent Application No. 10-2013-0073944 filed in the Korean Intellectual Property Office on Jun. 26, 2013, the entire contents of which application are incorporated herein by reference.

BACKGROUND

1. Field

The described technology relates generally to an organic light emitting diodes (OLED) display.

2. Description of Related Technology

An organic light emitting diodes display (OLEDD) includes a plurality of organic light emitting elements (OLED's) each respectively comprising an anode that is a hole injection electrode, an organic light emitting layer, and a cathode that is an electron injection electrode. Each organic light emitting element emits light due to photon energy generated when an exciton generated by combining an electron and a hole in the organic emission layer falls from an exited state to a ground state. The organic light emitting diodes display (OLEDD) displays a predetermined image by controlling the respective light emissions of its organic light emitting elements. Organic light emitting diodes (OLED's) may be degraded by external factors such as exposure to external moisture and oxygen, or ultraviolet (UV) rays. Accordingly, the packaging encapsulating the organic light emitting diode (OLED) is important, and the organic light emitting diode (OLED) may be encapsulated by an encapsulating substrate made of a metal or a glass.

Often, a touch panel is provided as an input device of the organic light emitting diodes display (OLEDD). The touch panel inputs information by being directly contacted on a screen thereof by a finger or a pen, and depending on the method of sensing the contacted portion, the touch panel may be classified into a resistive type of sensing where the contacted position is determined by a voltage gradient in a state that electrodes are formed at an upper plate or a rear plate and a DC voltage is applied, and a capacitive type of sensing a position where a voltage change of the upper and rear plates according to the contact is generated in a state that an equipotential is formed on a conductive layer.

Particularly, in the touch panel of the capacitive type, a plurality of Tx (transmission) wires extending in a horizontal direction and a plurality of Rx (receiving) wires extending in a vertical direction are formed on an encapsulating substrate. However, as resolutions increase, additional Tx wires and Rx wires must be formed on the encapsulating substrate of this type of touch panel such that the number of manufacturing steps needed during mass production is increased and a thickness of the touch panel portion increases.

To solve this problem, an ICTA (In Cell TSP AMOLED) structure separating the cathode to use as each Tx wire has been developed. However, in this case, an RC delay of the Tx wire may not be well controlled such that the RC delay of the Tx wire is determined according to a size of the organic light emitting diodes display (OLEDD), according to a resolution of the Tx wires and the Rx wires, and according to a material of the cathode. Accordingly, when a touch characteristic is deteriorated by the resistance of the Tx wires or a parasitic capacitance, the material of the cathode must be changed, or a thickness of the organic layer or a line width of a driving voltage layer (ELVDDL) must be reduced, such that there is a drawback that factors affecting the image display must be amended through estimation over a long period of time.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

An organic light emitting diodes display (OLEDD) with reduced resistance for its Tx wires (of an ICTA structure) is provided.

An organic light emitting diodes display (OLEDD) according to an exemplary embodiment includes: a lower substrate; a driving element formed on the lower substrate; a first electrode connected to the driving element; an organic emission layer formed on the first electrode; a second electrode formed on the organic emission layer; a resistance lowering wire formed within the same layer as that of the first electrode and connected to the second electrode; an upper substrate disposed on the second electrode; and a plurality of Rx wires formed on the upper substrate and separated from each other, wherein the layer of the second electrode includes a plurality of Tx wires separated with each other.

The Tx wires may be insulated from and cross the Rx wire, the resistance lowering wire may overlappingly underlie the Tx wire, and the resistance lowering wire may longitudinally extend in the same direction as the Tx wire.

A protective layer covering the driving element and a pixel definition layer covering the first electrode and the resistance lowering wire formed on the protective layer may be further included, and the resistance lowering wire may be connected to the Tx wire through a contact hole formed in the pixel definition layer.

A common voltage layer formed under the protective layer and transmitting a common voltage signal may be further included, and the common voltage layer may be connected to the Tx wire through the resistance lowering wire.

The first electrode may be disposed between two resistance lowering wires that are successively adjacent to each other among a series of successive but spaced apart resistance lowering wires.

The driving element may include a switching thin film transistor and a driving thin film transistor.

According to an exemplary embodiment, by forming the resistance lowering wire connected to the Tx wire forming the touch panel and with the same layer as the first electrode, the combined resistance of the Tx wire and the in-parallel resistance lowering wire is reduced thereby reducing an RC delay factor associated with transmitting a position detecting pulse by way of the Tx wire.

Accordingly, touch sensitivity may be improved in the organic light emitting diodes display (OLEDD) with high resolution.

DETAILED DESCRIPTION

In the following detailed description, only certain exemplary embodiments have been shown and described, simply by way of illustration. As those skilled in the art would realize in light of the disclosure, the described embodiments may be modified in various different ways, all without departing from the spirit or scope of the present teachings.

Accordingly, the drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present disclosure of invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, in the accompanying drawings, a so-called, "2Tr 1Cap" structured active matrix (AM) type of organic light emitting diodes display (OLEDD) in which a pixel includes two thin film transistors (TFT) and one capacitor is illustrated. However, the present teachings are not limited thereto. Therefore, an OLED's display may have various structures in which a pixel may include a plurality of TFTs and at least one capacitor, a wiring line may be further formed, and conventional wiring line may be omitted. Here, a pixel refers to a minimum repeat unit that populates the screen and is used to form the displayed image. An OLED's display displays an image through a plurality of pixels.

An OLED's display according to a first exemplary embodiment will now be described in detail with reference to FIG. 1 to FIG. 6.

Figure 1:
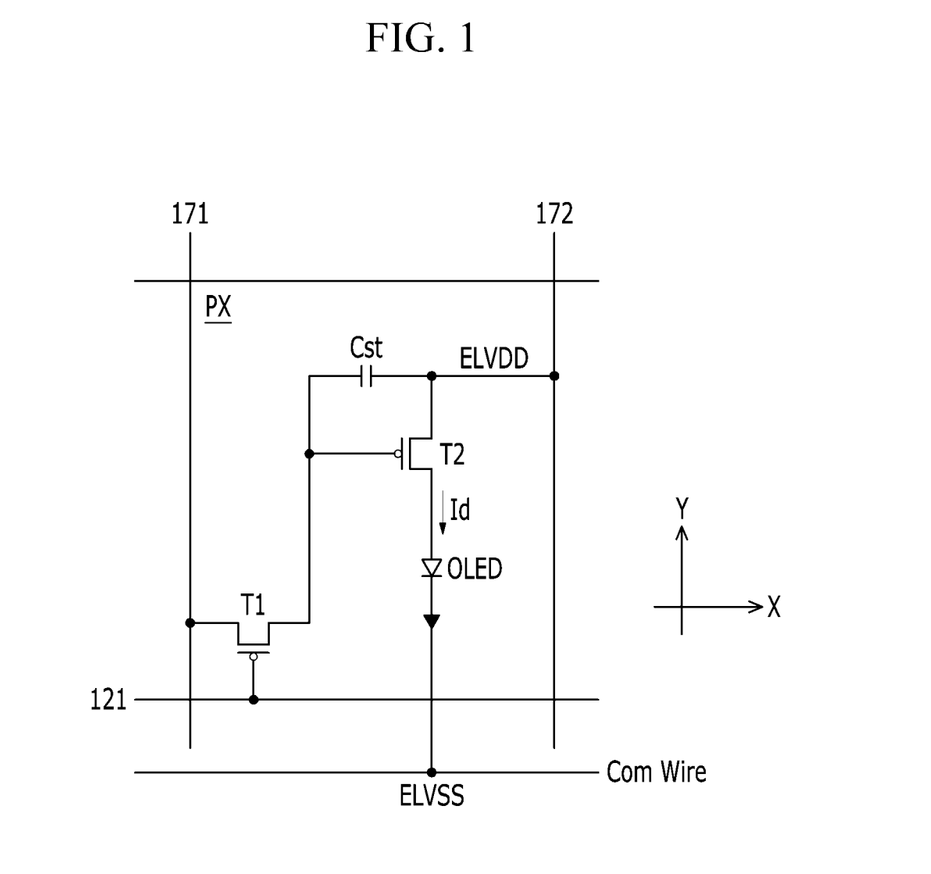
FIG. 1 is an equivalent circuit of one pixel of an organic light emitting diodes display (OLEDD) according to an exemplary embodiment.

FIG. 1 is an equivalent circuit diagram of a pixel of an OLED's display according to an exemplary embodiment.

As shown in FIG. 1, the OLED's display according to the first exemplary embodiment includes a plurality of signal lines 121, 171, and 172 and a plurality of pixels PX connected to the signal lines 121, 171, and 172 and arranged in a matrix form.

The signal lines include a plurality of scan lines (SL's) 121 extending in the horizontal X direction and configured for transmitting scan signals (or gate signals). The signal lines also include a plurality of data lines (DL's) 171 extending in the vertical Y direction and configured for transmitting data signals, as well as a plurality of driving voltage source lines (VL's) 172 also extending in the vertical Y direction and configured for transmitting a driving voltage ELVDD to the pixel PX. The scan lines 121 run parallel with each other in the horizontal row direction (X), while as mentioned the data lines 171 and the driving voltage lines 172 run parallel with each other in a column direction (Y). Additionally, there are so-called, Common voltage lines (Com Wires) that extend in the horizontal X direction and are configured for normally transmitting an ELVSS common voltage to each respective row when the OLED's of that row are in a normal light emitting mode. However, the Com Wires may function as so-called, Tx wires and transmit touch sensing pulses in the horizontal row direction (X) at time periods when the OLED's of that row are being switched from a first normal light emitting state (first output magnitude) to a different second normal light emitting state (second output magnitude). Each of the pixels PX includes a switching thin film transistor T1, a driving thin film transistor T2, a storage capacitor Cst, and an organic light emitting diode (OLED).

The switching thin film transistor T1 has a control terminal (gate), an input terminal (source), and an output terminal (drain). The control terminal is connected to the pixel's respective scan line 121, while the input terminal is connected to the pixel's respective data line 171, and the output terminal is connected to the driving thin film transistor T2 within the pixel unit PX. When the scan line (SL) 121 is active, the switching thin film transistor T1 is turned on so as to transmit a data signal present on the data line (DL) 171 to the driving thin film transistor T2.

The driving thin film transistor T2 also has a control terminal, an input terminal, and an output terminal. The control terminal of T2 is connected to the switching thin film transistor T1, the input terminal is connected to the driving voltage supply line 172, and the output terminal is connected to the organic light emitting diode OLED. When turned on to one degree or another, the driving thin film transistor T2 conducts an output current Id which passes through the OLED and is sunk by the ELVSS voltage normally present on the common voltage wire (Com Wire). The output current Id varies in amplitude in accordance with a voltage applied between the control terminal and the output terminal of T2.

The storage capacitor Cst is connected between the control terminal and the input terminal of the driving thin film transistor T2. The storage capacitor Cst charges to the voltage of the data signal applied to the control terminal of the driving thin film transistor T2 when T1 is turned on, and it maintains that voltage after the switching thin film transistor T1 is turned off. At the time that T1 is turned on and the difference between ELVDD and the voltage on the data line 171 is being charged onto the storage capacitor Cst it makes little difference what voltage signal is present on the Com Wire (normally at ELVSS) and that it the time when the Com Wire can serve as a Tx line for touch position determination.

The organic light emitting diode OLED of the pixel PX has an anode connected to the output terminal of the driving thin film transistor T2and a cathode connected to the Com Wire which normally supplies the common voltage ELVSS. The organic light emitting diode OLED displays an image by emitting lights with different intensities according to the output currents Id of the respective driving thin film transistors T2.

The switching thin film transistor T1 and the driving thin film transistor T2 may be n-channel insulated gate field effect transistors (IGFETs) or p-channel versions of such field effect transistors. The connection relationship among the thin film transistors T1 and T2, the storage capacitor Cst, and the organic light emitting diode OLED may vary.

A detailed structure of the pixel of the organic light emitting diode display of FIG. 1 will now be described in further detail with reference to FIG. 2 to FIG. 6 as well as FIG. 1.

Figure 2:
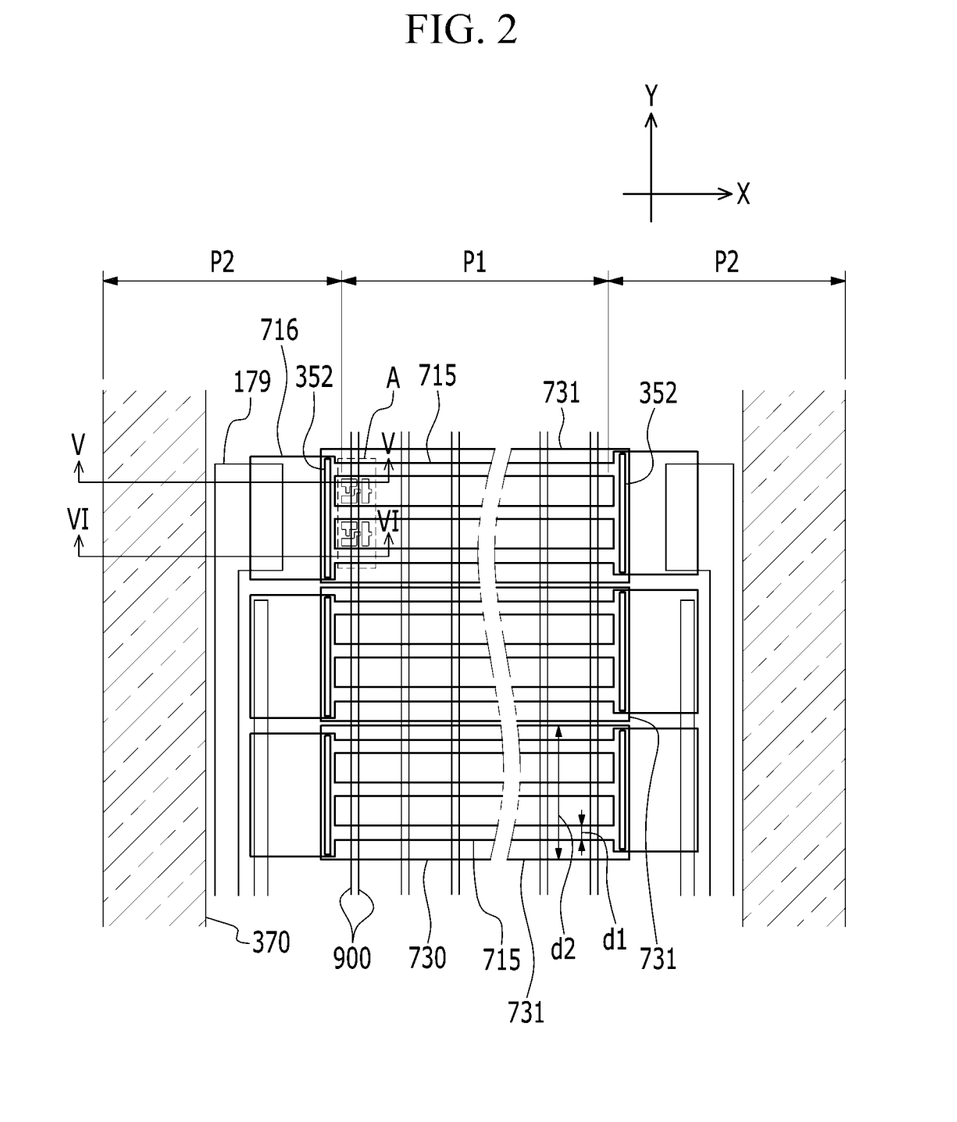
FIG. 2 is a layout view of an organic light emitting diodes display (OLEDD) according to an exemplary embodiment.

FIG. 2 is a layout view of an organic light emitting diodes display (OLEDD) according to an exemplary embodiment.

Figure 3:
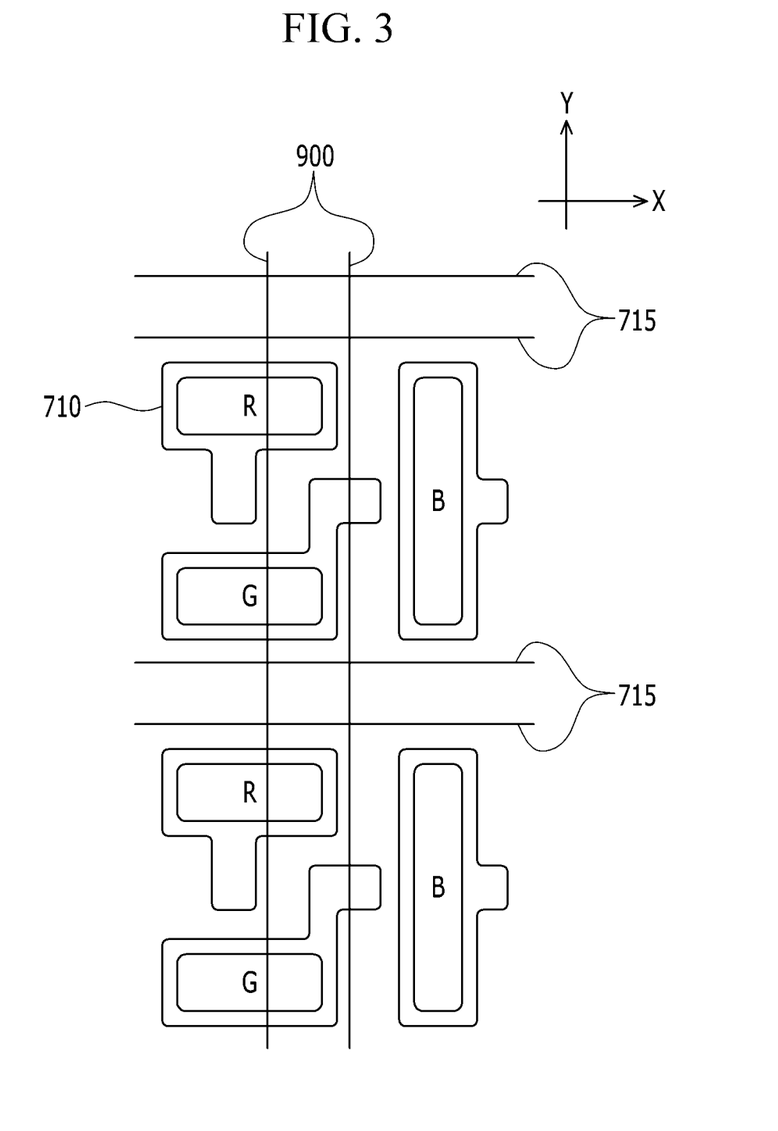
FIG. 3 is an enlarged cross-sectional view of a portion A of FIG. 2.
Figure 4:
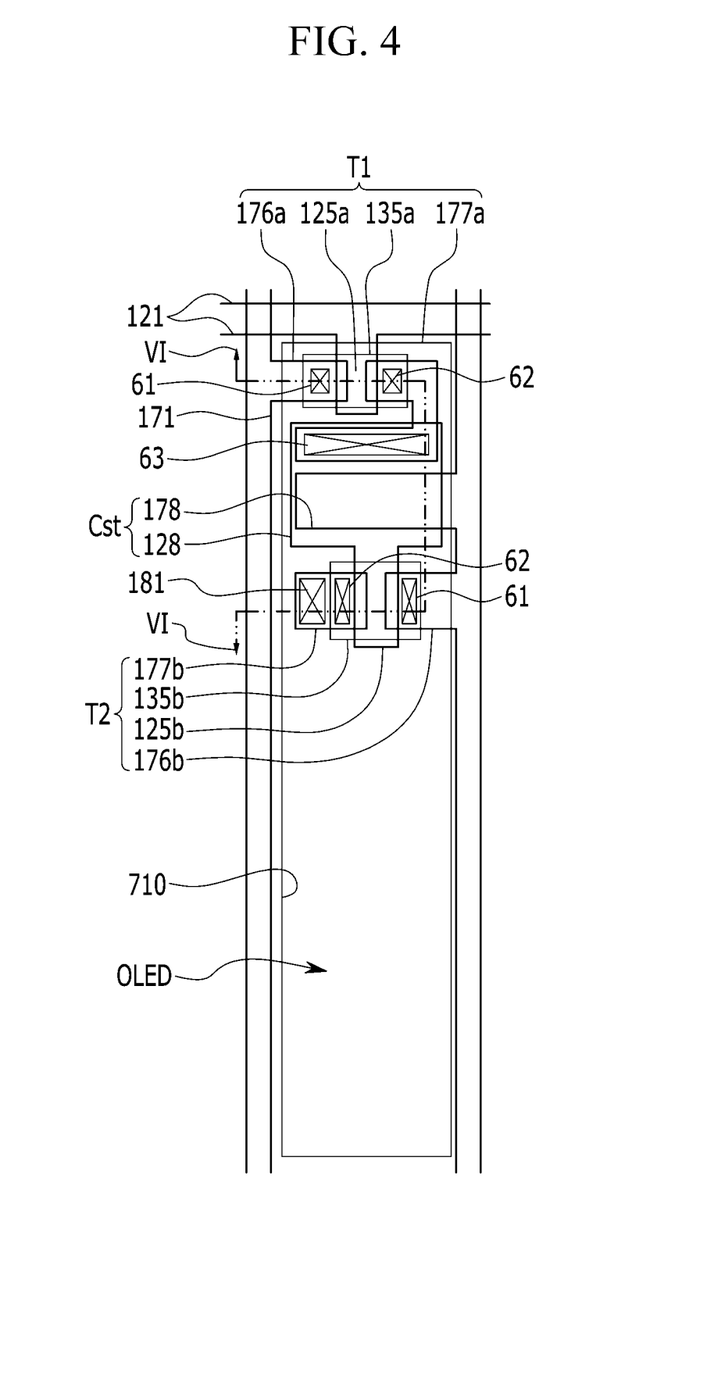
FIG. 4 is a layout view of one pixel of an organic light emitting diode s display (OLEDD) according to an exemplary embodiment.
Figure 5:
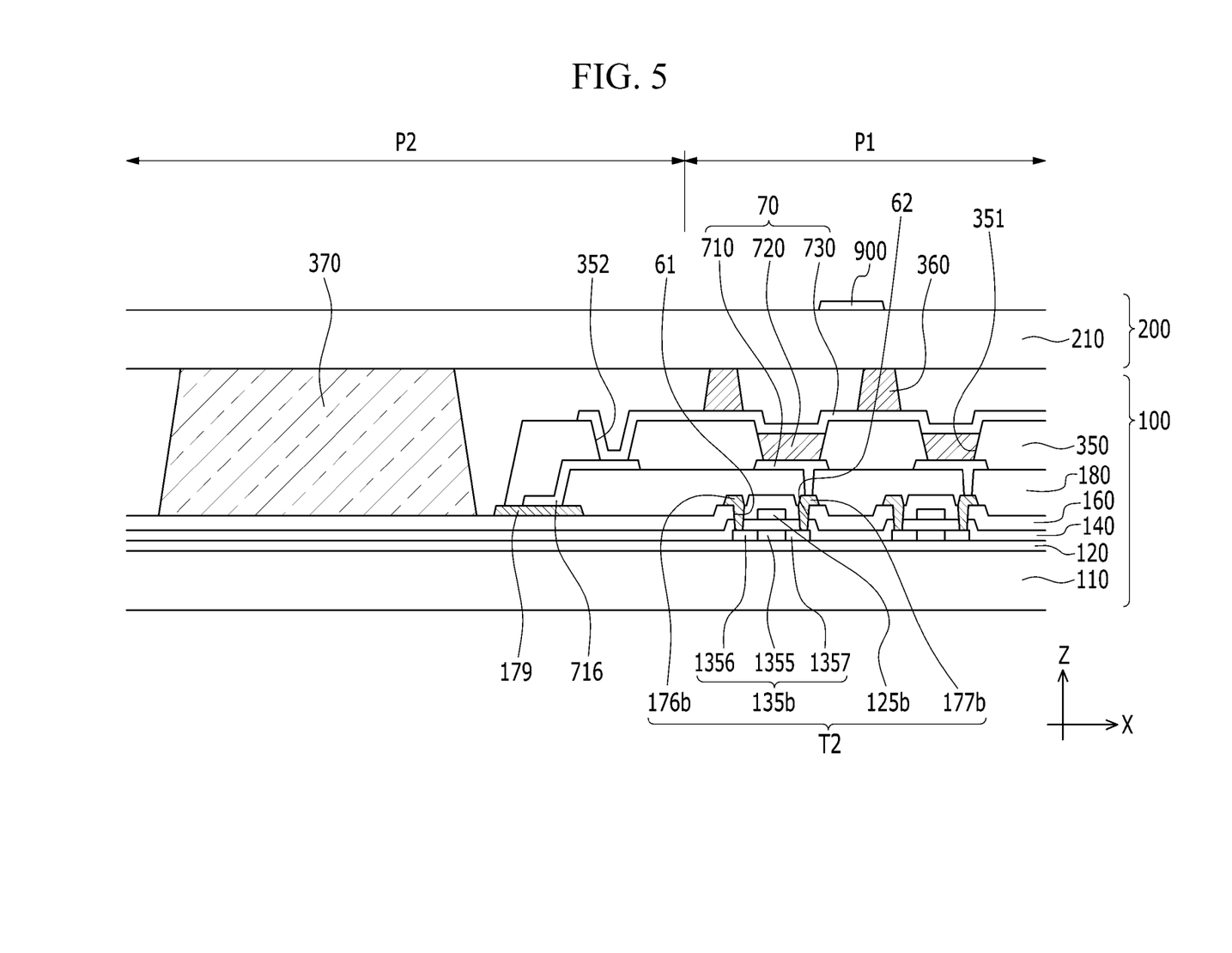
FIG. 5 is a cross-sectional view taken along the line V-V of FIG. 2.
Figure 6:
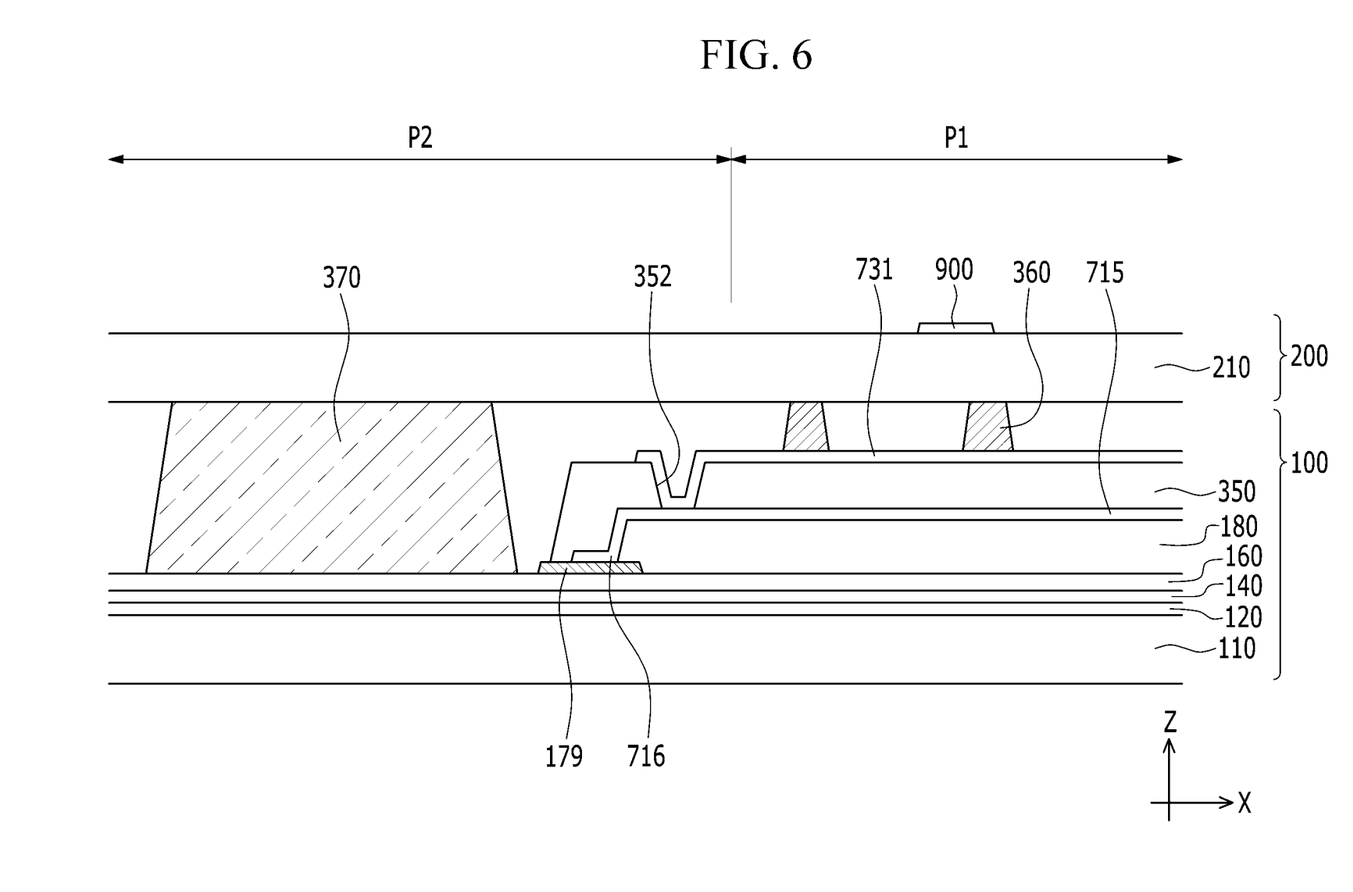
FIG. 6 is a cross-sectional view taken along the line VI-VI of FIG. 2.

FIG. 3 is an enlarged cross-sectional view of a portion A of FIG. 2 that contains two RGB pixels. FIG. 4 is a layout view of one subpixel of an organic light emitting diodes display (OLEDD) according to an exemplary embodiment. FIG. 5 is a cross-sectional view taken along the line V-V of FIG. 2. FIG. 6 is a cross-sectional view taken along the line VI-VI of FIG. 2.

As shown in FIG. 5, an organic light emitting diodes display (OLEDD) according to an exemplary embodiment includes a light emitting display substrate 100, an encapsulating substrate 200 facing the light emitting display substrate 100, and a sealant 370 interposed between the light emitting display substrate 100 and the encapsulating substrate 200, where as better seen in FIG. 2, the sealant 370 forms a ring which encapsulates the display area elements of the OLEDD inside that ring and between the light emitting display substrate 100 and the encapsulating substrate 200.

The light emitting display substrate 100 includes a lower substrate 110, driving elements T1 and T2 formed on the lower substrate 110, the latter including a switching thin film transistor T1 and a driving thin film transistor T2. The structure further includes a pixel electrode 710 serving as a first electrode of the OLED 70 and being connected to the driving elements T1 and T2. It includes an organic emission layer 720 formed on the pixel electrode 710 and a light-passing common electrode 730 as a second OLED electrode formed on the organic emission layer 720. Because the output light of the organic emission layer 720 is output through the common voltage electrode 730, the latter electrode needs to be a light-passing (e.g., transparent) as well as a conductive material. In general, the resistivity of such light-passing conductive materials (e.g., ITO, IZO) is higher than what designers would like it to be. In accordance with the present disclosure, there is also included a resistance lowering wire 715 (see FIGS. 2 and 6) formed to extend in the horizontal X direction and within the same layer as that of the pixel electrode 710 and to be connected to the light-passing common electrode 730 for example by way of contact hole 352 (FIG. 6). The resistance lowering wire 715 is electrically connected to be in parallel with a below described and corresponding Tx wire (731) such that the combined electrical resistance of the two is lowered.

The lower substrate 110 may be an insulative substrate made of glass, quartz, ceramic, plastic, etc.

A buffer layer 120 is formed on the lower substrate 110. The buffer layer 120 may have a single-layer structure composed of a silicon nitride (SiNx), or a dual-layered structure composed of a silicon nitride (SiNx) and a silicon oxide (SiOy) laminated on each other. The buffer layer 120 prevents penetration of undesired elements, such as impurities or moisture, and helps planarize the surface.

A switching semiconductive layer 135a and a driving semiconductive layer 135b are formed on the buffer layer 120 and are spaced apart from each other. These semiconductive layers 135a and 135b may be made of a polysilicon or a semiconductive oxide. The semiconductive oxide version may contain one member selected from the group consisting of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof, such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). If the semiconductive layers 135a and 135b are made of a semiconductive oxide, a separate protective layer may be added to protect the semiconductive oxide from outside environment factors such as a high temperature.

The semiconductive layers (e.g., islands) 135a and 135b may each include a respective channel region not heavily doped with impurities, and source and drain regions doped with impurities and formed at both sides of the channel region. The impurities vary according to the type of thin film transistors, and may be N-type impurities or P-type impurities.

The switching semiconductive layer 135a and the driving semiconductive layer 135b are each divided into a channel region 1355, and a source region 1356 and a drain region 1357 formed at respective sides of the channel region 135. The channel regions 1355 of the switching semiconductor layer 135a and the driving semiconductor layer 135b may include polysilicon not doped with impurities, that is, an intrinsic semiconductor, and the source regions 1356 and drain regions 1357 of the switching semiconductor layer 135a and the driving semiconductor layer 135b may include polysilicon doped with conductivity type imparting impurities, that is, semiconductor dopants.

A gate insulating film 140 is formed on the switching semiconductive layer 135a and the driving semiconductive layer 135b. The gate insulating film 140 may be a single layer or a plurality of layers containing at least one of a silicon nitride and a silicon oxide.

A scan line 121, a driving gate electrode 125b, and a first storage capacitor plate 128 are formed on the gate insulating film 140. The scan line 121 longitudinally extends in a horizontal X direction and transfers a scan signal, and includes a switching gate electrode 125a protruding (branching) from the scan line 121 toward the switching semiconductive layer 135a. The driving gate electrode 125b protrudes (branches) from the first storage capacitor plate 128 toward the driving semiconductive layer 135b. The switching gate electrode 125a and the driving gate electrode 125b overlap the channel regions 1355, respectively.

An interlayer insulating film 160 is formed on the scan line 121, the driving gate electrode 125b, and the first storage capacitor plate 128. Like the gate insulating film 140, the interlayer insulating film 160 may be formed of a silicon nitride or a silicon oxide.

Source contact holes 61 and drain contact holes 62 are formed in the interlayer insulating film 160 and the gate insulating film 140 to expose the source regions 1356 and the drain regions 1357, and storage contact holes 63 are formed therein to expose part of the first storage capacitor 128.

A data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128 are formed on the interlayer insulating film 160. Also, a common voltage layer 179 which is connected for transmitting the common voltage ELVSS of the pixel units is formed on the interlayer insulating layer 160. The common voltage layer 179 is formed along the peripheral area P2 surrounding the pixel area P1. Since light does not need to pass through the common voltage providing layer 179, it can be made of an electrically conductive material (e.g., one or more metals) having a lower resistivity than that of the common electrode 730.

The data line 171 transfers a data signal, and extends in a direction (Y) crossing the gate line 121. The driving voltage line 172 transfers a driving voltage, and is separated from the data line 171 and extends in the same direction (Y) as the data line 171.

The switching source electrode 176a protrudes from the data line 171 toward the switching semiconductive layer 135a, and the driving source electrode 176b protrudes from the driving voltage line 172 toward the driving semiconductive layer 135b. The switching source electrode 176a and the source electrode 176b are respectively connected to the source regions 1356 through the source contact holes 61. The switching drain electrode 177a faces the switching source electrode 176a, the driving drain electrode 177b faces the driving source electrode 176b, and the switching drain electrode 177a and the driving drain electrode 177b are respectively connected to the drain regions 1357 through the drain contact holes 62.

The switching drain electrode 177a is extended and electrically connected to the first storage capacitor plate 128 and the driving gate electrode 125b through the storage contact holes 63 formed in the interlayer insulating layer 160.

The second storage capacitor plate 178 protrudes from the driving voltage line 171, and overlaps the first storage capacitor plate 128. Accordingly, the first storage capacitor plate 128 and the second storage capacitor plate 178 constitute the storage capacitor Cst by using the interlayer insulating film 160 as a dielectric material.

The switching semiconductive layer 135a, the switching gate electrode 125a, the switching source electrode 176a, and the switching drain electrode 177a constitute the switching thin film transistor T1, and the driving semiconductive layer 135b, the driving gate electrode 125a, the driving source electrode 176b, and the driving drain electrode 177b constitute the driving thin film transistor T2.

A protective film 180 is formed on the switching source electrode 176a, the driving source electrode 176b, the switching drain electrode 177a, and the driving drain electrode 177b.

The pixel electrode 710, the resistance lowering wire 715, and a resistance lowering connection line 716 are formed on the protective layer 180.

The pixel electrode 710 is electrically connected to the driving drain electrode 177b of the driving thin film transistor T2 through a contact hole 181 formed in the interlayer insulating film 160, and serves as an anode of the organic light emitting diode.

The resistance lowering connection line 716 directly contacts the common voltage layer 179 and is formed at the peripheral area P2, and a plurality of resistance lowering wires 715 are divided from (branched out from) the resistance lowering connection line 716. The plurality of resistance lowering wires 715 are separated from each other and longitudinally extend in the same direction (the X direction) as the elongation direction of the common electrode 730. The pixel electrode 710 is positioned in the same layer as and in between the resistance lowering wires 715, and the resistance lowering wires 715 and the pixel electrode 710 do not contact each other.

The pixel electrode 710, the resistance lowering wire 715, and the resistance lowering connection line 716 may be made of an optically transparent conducting material such as ITO (indium tin oxide), IZO (indium zinc oxide), ZnO (zinc oxide), or $In_2O_3$ (indium oxide), or of a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

A pixel defining layer 350 is formed on edge portions of the pixel electrode 710 and the protective film 180. The pixel defining layer 350 has an opening 351 exposing the pixel electrode 710 and a contact hole 352 exposing the resistance lowering wire 715. The contact hole 352 is formed at the peripheral area P2. The pixel defining film 180 may be made of a resin such as polyacrylate resin or polyimide resin, a silica-based inorganic material, or the like.

The organic emission layer 720 is formed in the openings 351 of the pixel defining layer 350. The organic emission layer 720 is formed as a plurality of layers including one or more of an emission layer, a hole-injection layer HIL, a hole-transporting layer HTL, an electron-transporting layer ETL, and an electron-injection layer EIL. If the organic emission layer 720 includes all of them, the hole-injection layer may be positioned on the pixel electrode 710 serving as an anode, and the hole-transporting layer, the emission layer, the electron-transporting layer, and the electron-injection layer may be sequentially laminated on the pixel electrode 710.

The organic emission layer 720 may include a red organic emission layer section for emitting red light, a green organic emission layer section for emitting green light, and a blue organic emission layer section for emitting blue light. The red organic emission layer section, the green organic emission layer section, and the blue organic emission layer section are respectively formed in red, green, and blue pixels, thereby enabling the displaying of full color images.

Moreover, the red organic emission layer, green organic emission layer, and blue organic emission layer of the organic emission layer 720 may be respectively laminated on the red pixel, green pixel, and blue pixel, and a red color filter, a green color filter, and a blue color filter may be formed for the respective pixels, thereby displaying a color image. In another example, a white organic emission layer for emitting white light may be formed in all of the red, green, and blue pixels, and a red color filter, a green color filter, and a blue color filter may be formed for the respective pixels, thereby displaying a color image. If the white organic emission layer and the color filters are used to display a color image, there is no need to use a deposition mask for separately depositing the red, green, and blue organic emission layers in the respective pixels, i.e., the red, green, and blue pixels.

The white organic emission layer described in this example may be formed as one organic emission layer or a plurality of organic emission layers that are laminated to emit white light. For example, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

The common electrode 730 is formed on the pixel defining layer 350 and the organic emission layer 720. The common electrode 730 electrically connects to a plurality of Tx wires 731 that are separated from each other.

The Tx wires 731 overlap one or more corresponding resistance lowering wires 715. The resistance lowering wires 715 longitudinally extend in the same direction (the X direction)

as the Tx wires 731. A width d1 (as measured in the Y direction) of the resistance lowering wire 715 is smaller than a width d2 (as measured in the Y direction) of the Tx wire 731 such that one Tx wire 731 may overlap a plurality of corresponding resistance lowering wires 715.

Also, the resistance lowering wire 715 is connected to its corresponding Tx wire 731 through the contact hole 352 formed in the pixel definition layer 350. The common voltage layer 179 is connected to the resistance lowering connection line 716 and the resistance lowering wire 715 such that the common voltage layer 179 is connected to the Tx wire 731 through the resistance lowering connection line 716. Accordingly, the common voltage transmitted through the common voltage layer 179 is transmitted to the Tx wire 731 and is simultaneously transmitted to the resistance lowering wire 715 such that the resistance of the Tx wire 731 when combined in parallel with its corresponding resistance lowering wire(s) 715 is decreased and an RC delay associated with the Tx wire 731 may be reduced.

The common electrode 730 may be made of a transparent conducting material such as ITO (indium tin oxide), IZO (indium zinc oxide), ZnO (zinc oxide), or $In_2O_3$ (indium oxide), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 serves as a cathode of the organic light emitting diode OLED. The pixel electrode 710, the organic emission layer 720, and the common electrode 730 constitute an organic light emitting diode (OLED) 70.

A spacer 360 to maintain an interval (in the Z direction) with an upper substrate 210 is formed on the common electrode, and a plurality of Rx wires 900 separated from each other are formed on the upper substrate.

The Rx wires 900 and the Tx wires 731 cross and are insulated from each other, and the Rx wires 900 and the Tx wires 731 together constitute a capacitive type touch panel for a touch sensing. In the touch panel including the Rx wires 900 and the Tx wires 731, if a touch voltage is charged into and developed between the Rx wire 900 and the Tx wire 731 that are crossed (where charging happens for example when the row of pixels is being refreshed with application of respective new drive voltages) and any one position is touched through a capacitance-increasing input means such as a finger or a pen, a localized voltage drop is generated due to the localized capacitance-increase thereby determining position coordinates. As described, the Tx wires 731 are formed in the light emitting display substrate 100 and the Rx wires 900 are formed in the encapsulating substrate 200 such that a manufacturing process of the organic light emitting diodes display (OLEDD) is reduced and a thickness thereof may be kept small.

While this disclosure has been described in connection with what is presently considered to be practical exemplary embodiments, it is to be understood that the present teachings are not limited to the disclosed embodiments, but, on the contrary, they are intended to cover various modifications and equivalent arrangements included within the spirit and scope of the present teachings.

What is claimed is:

1. An organic light emitting diodes display (OLEDD) comprising:
    a lower substrate;
    a driving element formed on the lower substrate;
    a first electrode formed in a first layer and connected to the driving element;
    an organic emission layer formed on the first electrode;
    a light-passing second electrode formed in a second layer and on the organic emission layer;
    a resistance lowering wire formed in the same first layer as that of the first electrode and connected to the second electrode;
    an upper substrate disposed on the second electrode;
    a plurality of Rx wires formed on the upper substrate and separated from each other; and
    a plurality of Tx wires formed on the lower substrate, in the same second layer as that of the second electrode and separated from each other, the Tx wires insulatively crossing with the Rx wires, at least one of the Tx wires forming a parallel resistances circuit in combination with the resistance lowering wire;
    whereby a capacitive type touch panel is formed by the crossing pluralities of the Rx wires and the Tx wires.

2. The organic light emitting diodes display (OLEDD) of claim 1, wherein
    the resistance lowering wire extends overlappingly under the at least one Tx wire.

3. The organic light emitting diodes display (OLEDD) of claim 2, wherein
    the resistance lowering wire longitudinal extends in the same direction as the at least one Tx wire.

4. The organic light emitting diodes display (OLEDD) of claim 2, further comprising:
    a protective layer covering the driving element; and
    a pixel definition layer covering the first electrode and the resistance lowering wire formed on the protective layer, and
    wherein the resistance lowering wire is connected to the at least one Tx wire through a contact hole formed in the pixel definition layer.

5. The organic light emitting diodes display (OLEDD) of claim 2, further comprising
    a common voltage layer formed under the protective layer and transmitting a common voltage signal,
    wherein the common voltage signal transmitted through the common voltage layer is coupled to the Tx wire by way of at least a portion of the resistance lowering wire.

6. The organic light emitting diodes display (OLEDD) of claim 2, wherein
    the first electrode is disposed between plural resistance lowering wires that are successively adjacent to each other.

7. The organic light emitting diodes display (OLEDD) of claim 2, wherein
    the driving element includes a switching thin film transistor and a driving thin film transistor.

8. The organic light emitting diodes display (OLEDD) of claim 2, wherein:
    the resistance lowering wire is formed of a light-passing conductive material.

9. The organic light emitting diodes display (OLEDD) of claim 8, wherein:
    the light-passing conductive material of the resistance lowering wire is selected from the group consisting of: ITO (indium tin oxide), IZO (indium zinc oxide), ZnO (zinc oxide) and In2O3 (indium oxide).

10. The organic light emitting diodes display (OLEDD) of claim 2, wherein:
    the resistance lowering wire is formed of a light-blocking conductive material.

11. The organic light emitting diodes display (OLEDD) of claim 10, wherein:
    the light-blocking conductive material of the resistance lowering wire is selected from the group consisting of:

lithium (Li), calcium (Ca), lithium fluoride/calcium (LiF/Ca), lithium fluoride/aluminum (LiF/Al), aluminum (Al), silver (Ag), magnesium (Mg) and gold (Au).

* * * * *